(12) United States Patent
Hiroshima et al.

(10) Patent No.: US 6,335,642 B1
(45) Date of Patent: Jan. 1, 2002

(54) IMPEDANCE-TO-VOLTAGE CONVERTER

(75) Inventors: Tatsuo Hiroshima; Koichi Nakano; Muneo Harada; Toshiyuki Matsumoto, all of Hyogo-ken; Yoshihiro Hirota, Kyoto, all of (JP)

(73) Assignees: Sumitomo Metal Industries Limited, Osaka; Hokuto Electronics Inc., Hyogo, both of (JP)

( * ) Notice: Subject to any disclaimer, the term of this patent is extended or adjusted under 35 U.S.C. 154(b) by 0 days.

(21) Appl. No.: 09/381,673
(22) PCT Filed: Jan. 14, 1999
(86) PCT No.: PCT/JP99/00098
  § 371 Date: Sep. 22, 1999
  § 102(e) Date: Sep. 22, 1999
(87) PCT Pub. No.: WO99/38020
  PCT Pub. Date: Jul. 29, 1999

(30) Foreign Application Priority Data

Jan. 23, 1998 (JP) .............................. 10-11581
Feb. 6, 1998 (JP) ........................... 10-026240
Dec. 9, 1998 (JP) ........................... 10-350021

(51) Int. Cl.$^7$ ................................................ H03D 1/00
(52) U.S. Cl. ........................ 327/102; 327/50; 327/103; 324/691
(58) Field of Search ............................... 327/102, 103, 327/50; 325/649, 691

(56) References Cited

U.S. PATENT DOCUMENTS

| | | | |
|---|---|---|---|
| 4,473,796 A | * | 9/1984 | Nankivil ..................... 327/691 |
| 4,498,044 A | * | 2/1985 | Horn .......................... 324/649 |
| 4,918,376 A | | 4/1990 | Poduje et al. ................ 324/663 |
| 5,416,470 A | * | 5/1995 | Tanaka et al. ............... 340/664 |
| 5,515,723 A | | 5/1996 | Tsuchida et al. |
| 5,701,101 A | | 12/1997 | Weinhardt et al. |
| 5,808,516 A | | 9/1998 | Barber |
| 5,886,529 A | * | 3/1999 | Wakamatsu ................. 324/601 |
| 6,054,867 A | * | 4/2000 | Wakamatsu ................. 324/650 |

FOREIGN PATENT DOCUMENTS

| | | |
|---|---|---|
| DE | 3413849 A1 | 8/1985 |
| DE | 4135991 C1 | 12/1992 |
| EP | 1580335 | 12/1980 |

(List continued on next page.)

OTHER PUBLICATIONS

Monticelli et al. "Op–amp circuit measures diode–junction capacitance" Electronics Week, vol. 48, No. 14, July 10, 1975, pp. 112–113.

Dai Ming Yuan, Wien–Robinson–Oszillator zur Messung kleiner Kapazitätsänderngen, Elektronik, vol. 37, No. 9, Apr. 29, 1988, pp. 86–89.

Primary Examiner—Terry D. Cunningham
(74) Attorney, Agent, or Firm—Barnes & Thornburg

(57) ABSTRACT

A impedance-to-voltage converter for converting an impedance of a target to a voltage is described which comprises an operational amplifier (OP), a coaxial cable consisting a signal line and shielding element(s), and an AC signal generator. A feedback impedance circuit is connected between output and inverting terminals of the OP, and whereby a non-inverting terminal and the inverting terminal are an imaginal-short condition. One end of the signal line is connected to the inverting input terminal of the OP and the other end is connected to one electrode of the target and the AC signal generator is connected to the non-inverting input terminal of the OP. The shielding element comprises at least one shielding layer surrounding the signal line and is connected to the non-inverting input terminal of the OP, and thus the signal line and the shielding layer are the same voltage due to the imaginal-short of the input terminals of the OP, resulting in reduction of noise on the signal line.

18 Claims, 5 Drawing Sheets

FOREIGN PATENT DOCUMENTS

| | | |
|---|---|---|
| EP | 0193421 A1 | 9/1986 |
| EP | 0 500 203 A | 8/1992 |
| GB | 2002143 A | 2/1979 |
| GB | 2020816 A | 11/1979 |
| JP | 06180336 | 6/1994 |
| JP | 09 280806 A | 10/1997 |

* cited by examiner

# IMPEDANCE-TO-VOLTAGE CONVERTER

TECHNICAL FIELD

The present invention relates to an impedance-to-voltage converter (hereinafter referred to as "a Z/V converters") for outputting a voltage corresponding to an impedance value of a target to be detected using an operational amplifier. More particularly, the present invention relates to a Z/V converter using an operational amplifier, which can remove the influence of stray capacitances on a signal line, and thereby can produce a voltage corresponding to an impedance of a target to be detected all the more accurately.

BACKGROUND ART

FIG. 1 schematically illustrates a prior art electrostatic capacitance-to-voltage converter described in Japanese Patent Public Disclosure (Laid-open) No. 61-14578. This electrostatic capacitance-to-voltage converter has been proposed to solve the following problems caused by stray capacitances on a cable connecting an unknown electrostatic capacitance to an input terminal of an operational amplifier. That is, the stray capacitances on the cable are superimposed on the electrostatic capacitance to be detected and the values of the stray capacitances vary due to movements, bending and so on of the cable, so that the impedance value of the electrostatic capacitance may not be converted into a correctly-associated voltage.

SUMMERY OF THE INVENTION

As shown in the prior art, when the value of the unknown electrostatic capacitance Cx is smaller, the influence of stray capacitances on the lines becomes prominent, thereby causing a problem that the converter is prevented from correctly converting the capacitance Cx into a voltage. In addition, in a case where one electrode of the capacitance Cx is biased to a certain voltage, no AC signal can be applied to the capacitor Cx, thereby causing another problem that the capacitance Cx cannot be converted into a voltage at all.

The present invention has been proposed to solve such inherent problems in a prior art as shown in FIG. 1. Therefore, it is an object of the present invention to provide an impedance-to-voltage converter (Z/V converter) which is capable of highly accurately converting an impedance value Z of a target or a component to be detected into a voltage V without any influence of stray capacitances occurring between a signal line and a shielding means, even if the impedance value Z is relatively small.

In addition, it is an object of the present invention to provide a Z/V converter which is capable of highly accurately converting the impedance value Z of a target or a component to be detected into a voltage V without influence by stray capacitances between a signal line and a shielding means, even if one electrode of the target is kept at a certain voltage.

In order to achieve objects mentioned above, an impedance/voltage (Z/V) converter for converting an impedance of a target to a voltage comprising an operational amplifier having a feedback impedance circuit connected between an output terminal and an inverting input terminal thereof, a signal line having one end connected to the inverting input terminal of the operational amplifier and the other end connected to one electrode of a target impedance, alternating current (AC) signal generator connected to a non-inverting input terminal of the operational amplifier, and at least one shields comprising at least one shielding layer which surrounds at least a portion of the signal line and is connected to the non-inverting input terminal of the operational amplifier and the AC signal generator, wherein the inverting and non-inverting terminals are imaginal-short, whereby the operational amplifier outputs from its output terminal a voltage corresponding to the impedance value of the target.

The shielding layer preferably comprises a mesh structure or tube structure. In addition thereto, it is preferable that the shield further includes a second shielding layer surrounding the outer surface of the first shielding layer, which comprises a mesh structure or tube structure and is connected to the non-inverting input terminal of the operational amplifier and the AC signal generator or to a reference voltage.

Preferably, the impedance of the target and the feedback impedance circuit both have the same character comprising a resistive, capacitive or inductive one or any combination thereof. In such a case, S/N ratio of the apparatus may be improved. Other combinations can be acceptable and when the impedance of the target is an electrostatic capacitance, and the feedback impedance circuit is a resistance, it is easy to integrate the operational amplifier and the feedback impedance circuit in a chip.

When a generator of a DC voltage corresponding to the impedance value of the target is provided, further processing is made easier. It is also possible to modify the Z/V converter such that the feedback impedance circuit is a second target impedance which is unknown, in which case an output voltage of the operational amplifier corresponds to the ratio of the first and second targets impedances.

BEST MODE FOR CARRYING OUT THE INVENTION

A Z/V converter according to the present invention will hereinafter be described in detail with reference to the accompanying FIGS. 2–7.

Figure 1:
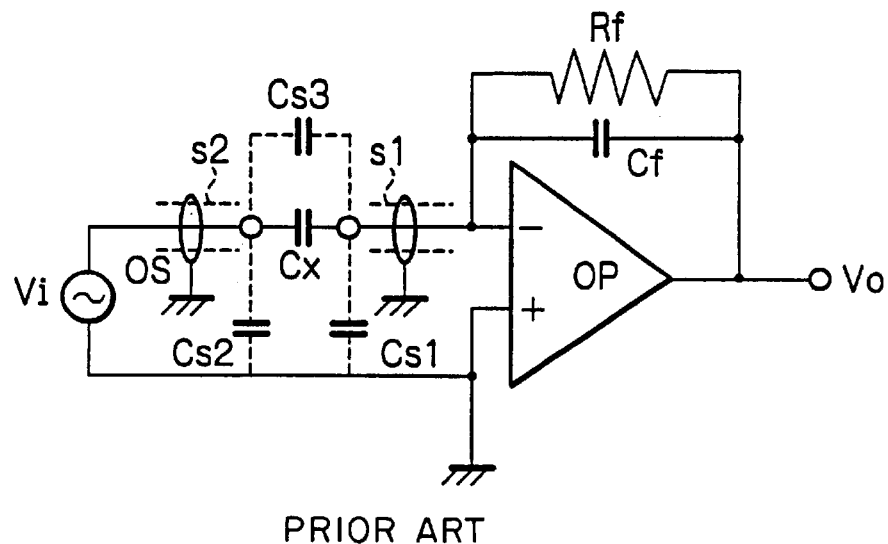
FIG. 1 is a circuit diagram illustrating an electrostatic capacitance-to-voltage converter of a prior art.
Figure 2:
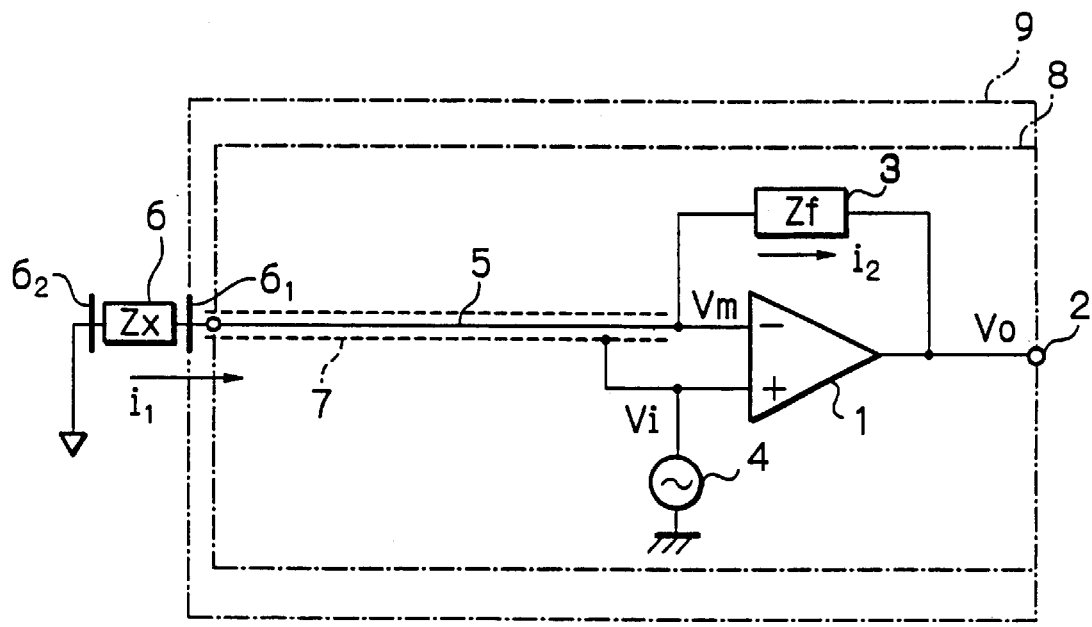
FIG. 2 shows a circuit diagram of a first embodiment of an impedance-to-voltage (Z/V) converter according to the present invention.
Figure 3:
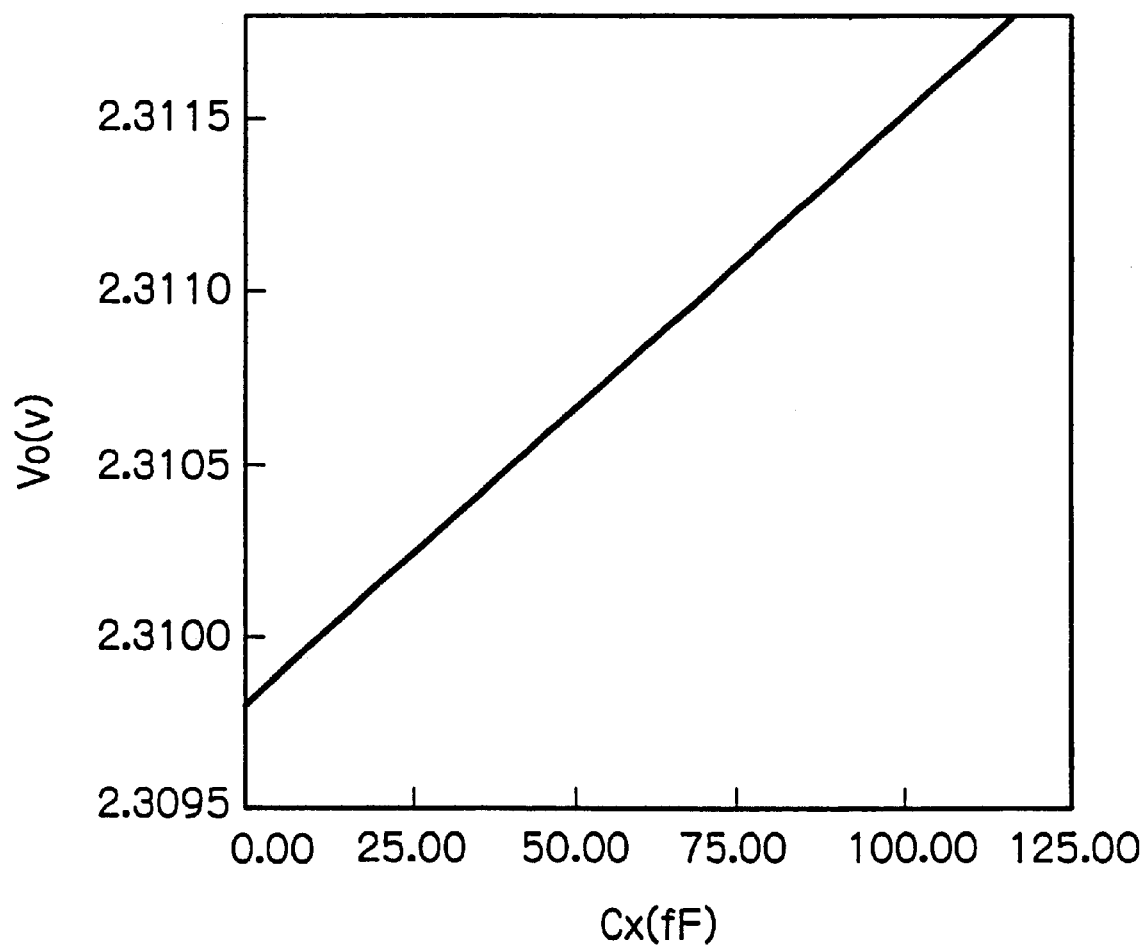
FIG. 3 is a graph representing a tested example of the relationship between a capacitance Cx and an output voltage Vo where an impedance of a target to be detected is the capacitance.

FIG. 2 is a circuit diagram schematically illustrating a first embodiment of the Z/V converter according to the present invention. In FIG. 2, the numeral 1 denotes an operational amplifier having a voltage gain extremely much larger than a closed loop gain. A feedback impedance circuit 3 is connected between an output terminal 2 and an inverting input terminal (−) of the operational amplifier 1 to form a negative feedback loop across the operational amplifier 1. The feedback impedance circuit 3 may be arbitrary impedance component such as a resistor, a capacitor, an inductor or any combination thereof. The operational amplifier 1 has a non-inverting input terminal (+) connected to an AC signal generator 4 for generating an alternate current (AC) voltage. The inverting input terminal (−) of the operational amplifier is also connected to one end of a signal line 5. The other end of the signal line 5 is connected to a sensing electrode $6_1$ of a target or target component 6, an impedance value of which is measured. The target may be arbitrary impedance component such as a resistor, a capacitor, an inductor or any combination thereof. The other electrode $6_2$ of the target 6 is grounded, or clamped to a constant DC voltage (not equal to the ground level) or kept an open state or non-connection state. Although the second electrode $6_2$ might be applied with an AC bias, more complicated mathematical analysis would be required for an output voltage of the operational amplifier A shield 7 consisting of a shielding layer is wrapped round the signal line 5 in order to prevent external unwanted signals such as noise from being introduced into the signal line 5. The shield 7 is not grounded but is connected to the non-inverting input terminal (+) of the operational amplifier 1 and hence the AC signal generator 4.

Since the operational amplifier 1 is provided with the negative feedback by means of the circuit including the feedback impedance circuit 3 and it has a voltage gain which is far larger than its closed loop gain, the inverting input terminal (−) and the non-inverting input terminal (+) of the operational amplifier 1 are in an imaginal-short state, so that a voltage difference therebetween is substantially zero. Accordingly, the signal line 5 and the shield 7 respectively connected to the inverting and non-inverting input terminals have the same voltage, so that it is possible to cancel any stray capacitances which may take place between the signal line 5 and the shield 7. This is true irrespective of the length of the signal line 5, and this is also true whether the signal line 5 is moved, bent, or folded back.

It is assumed that the AC voltage output from the AC signal generator 4 is Vi, the unknown impedance value of the target 6 is Zx, a current flowing through the target 6 is $i_1$, a known impedance value of the feedback impedance circuit 3 is Zf, a current flowing through the feedback impedance circuit 3 is $i_2$, a voltage at the inverting input terminal (−) of the operational amplifier 1 is Vm, and an output voltage of the operational amplifier 1 is Vo. Further, it is assumed that the second electrode $6_2$ of the target 6 is grounded. The voltage Vm at the inverting input terminal (−) is at the same as the AC voltage Vi generated from the AC signal generator 4, because the two input terminals of the operational amplifier 1 are in an imaginal-short state, as mentioned above. That is, Vi=Vm.

The currents $i_1$, $i_2$ are expressed by the following Equations:

$$i_1=-Vm/Zx=-Vi/Zx$$

$$i_2=(Vm-Vo)/Zf=(Vi-Vo)/Zf$$

Since $i_1=i_2$ because of a sufficiently high input impedance of the operational amplifier 1, the output voltage Vo of the operational amplifier 1 is expressed by the following Equation (1):

$$Vo=Vi(1+Zf/Zx) \qquad (1)$$

The Equation (1) represents that the operational amplifier 1 outputs an AC voltage Vo which varies dependently on the impedance value Zx.

From the foregoing, it is understood that a block 8 illustrated by one-dot chain lines including the signal line 5, the shield 7, the AC signal generator 4, the operational amplifier 1 connected to the signal line and the feedback impedance circuit 3 constitutes a Z/V converter for converting the impedance value Zx of the target component 6 connected to the other terminal of the signal line 5 into a voltage Vo corresponding thereto.

It should be noted here that since the inverting and non-inverting input terminals of the operational amplifier 1 are in an imaginal-short state, any stray capacitances arisen between the signal line 5 and the shield 7 will not appear at the inverting input terminals or between the two input terminals of the operational amplifier 1. Thus, the output voltage Vo of the operational amplifier 1 does not include any term relating to the stray capacitances occurring between the signal line 5 and the shield 7. Therefore, even if the impedance value Zx of the target 6 is small, the voltage Vo from the operational amplifier 1 corresponds only to the small impedance Zx.

As explained above, the output voltage Vo of the operational amplifier 1 is represented by the Expression (1), where the value Zf of the feedback impedance circuit 3 and the frequency and amplitude of the AC signal Vi are known. Further, the output Vo of the operational amplifier 1 has the same frequency as the AC signal voltage Vi and its amplitude can be obtained by detecting the peaks of the output wave of the amplifier 1. Therefore, by solving the Equation (1), the impedance value Zx can be calculated therefrom. In a case where the impedance Zx of the target 6 is a capacitance Cx (Zx=1/(jωCx) where ω is an angular frequency of the AC signal generator 4), the Vo varies linearly to the Cx as apparent from the Equation (1). In a test, the relationship between the Cx and an amplitude of the Vo has been obtained as a graph shown in FIG. 3.

Alternatively, by providing the output voltage Vo to a circuit to obtain a DC voltage Vdd associated with the AC voltage Vo, the impedance value Zx can be calculated using the Vdd. The circuit generating the DC voltage Vdd corresponding to the output voltage Vo can be provided by any AC-DC converter such as a rectifier and smoothing circuit. If necessary, such an AC-DC conversion may be executed after an amplification of the voltage Vo.

It is therefore possible to implement a detector for detecting the impedance value Zx of the target 6 by combining the block 8 and a processing circuit which calculates the impedance Zx from the output voltage Vo of the operational amplifier 1 or the block 8, the AC-DC converter and the processing circuit.

In the first embodiment illustrated in FIG. 2, the shield 7 may be a tube-type shielding means. In addition, the shield 7 may be formed in a single layer mesh structure which comprises knitted narrow metal strips in order to provide a flexible coaxial cable comprising of the signal line 5 and the shield 7.

With the shield 7 of the single layer mesh structure, however, a high frequency signal, if generated from the AC signal generator 4, would leak from the signal line 5 through micro-holes of the mesh structure 7, resulting in possibly affecting the AC output voltage Vo. In addition, high frequency external noise may also be introduced into the signal line 5 through the micro-holes, in which case the AC output voltage Vo would be affected by the external noise. Furthermore, if an operator touches such a coaxial cable having a shield means of a single layer mesh structure by hand, the output voltage Vo from the operational amplifier 1 may vary.

Figure 4:
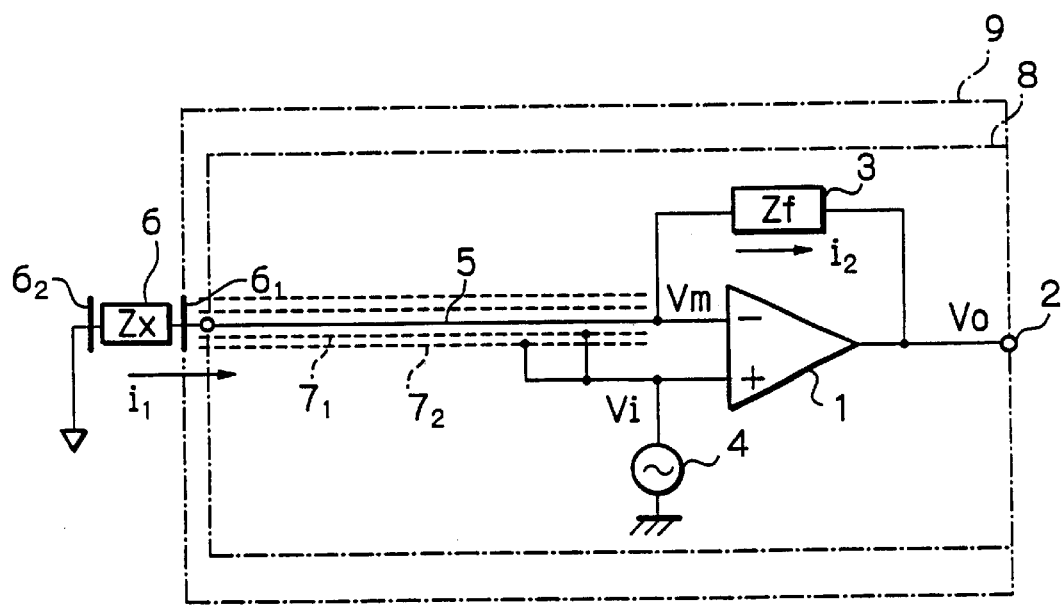
FIG. 4 illustrates a circuit diagram of a second embodiment of a Z/V converter according to the present invention.

FIG. 4 illustrates a second embodiment of a Z/V converter according to the present invention which can perform Z/V conversion in a high accuracy, even if a shield means is made in a mesh structure to provide flexibility. In FIG. 4, the same components as those in the first embodiment in FIG. 2 are designated by the same reference numerals. The second embodiment differs from the first one in that a shield means is made in a double-layer mesh structure comprising an inner shield (a first shielding layer) $7_1$ and an outer shield (a second shielding layer) $7_2$, both of which are connected to a non-inverting input terminal of an operational amplifier 1.

In the second embodiment, since the shield means has he double-layer mesh structure (the inner and outer shields $7_1$ and $7_2$), holes of thereof have smaller diameters as compared with those of the single-layer mesh structure, so that even if a high frequency signal is generated from an AC signal generator 4, the leaking electric field of the high frequency signal from a signal line 5 into the shields $7_1$, $7_2$ is reduced. Further, the influence of external noise is also reduced. Therefore, it is possible to produce an output voltage Vo correctly corresponding to an impedance value Zx to be detected. For example, in a case that the impedance of an target 6 is an electrostatic capacitance and the frequency of the signal Vi is approximately 1 MHz, touching the coaxial cable by hand may cause fluctuations in the output Vo of approximately several hundreds ppm when using a single-mesh structure as the shield means, while a double-mesh structure will substantially eliminate such fluctuations even if a hand touches the coaxial cable.

Figure 5A:
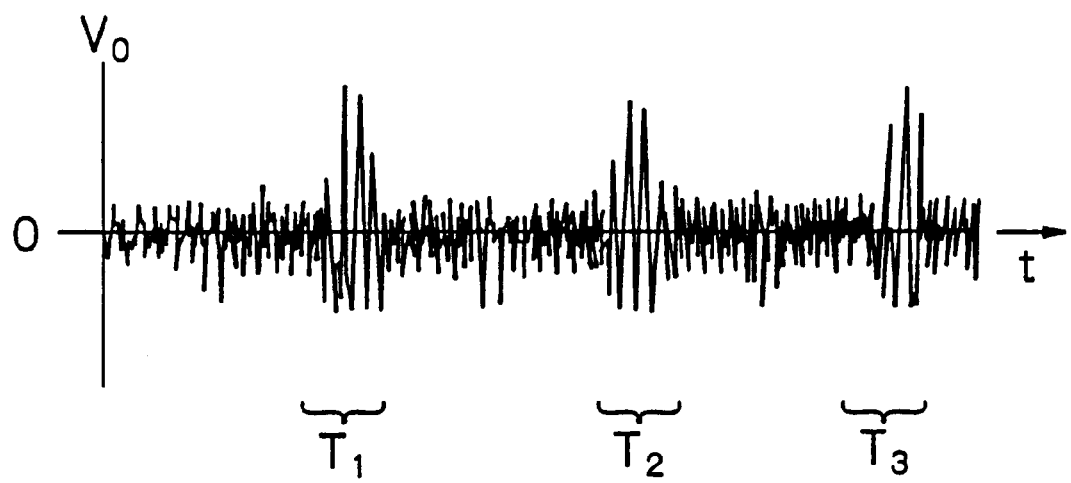
FIGS. 5(A) and 5(B) are graphs showing the results of noise influence tested example using the first and second embodiments.

A test using the first and second embodiments as moisture sensors has been practiced to examine the influence of noise caused by touching the single-layer and double-mesh structures in the embodiments, wherein the AC signal generator 4 of each embodiment was set to generate a AC signal having a frequency of 1 MHz, and the coaxial cable was touched intermittently by hand. FIGS. 5(A) and (B) respectively show graphs of the test results regarding the first and second embodiments in which each coordinate axis represents an AC voltage Vo output from the operational amplifier 1 and each abscissa axis represents time t. T1, T2 and T3 represent time periods during which the cable was touched by hand.

Figure 5B:
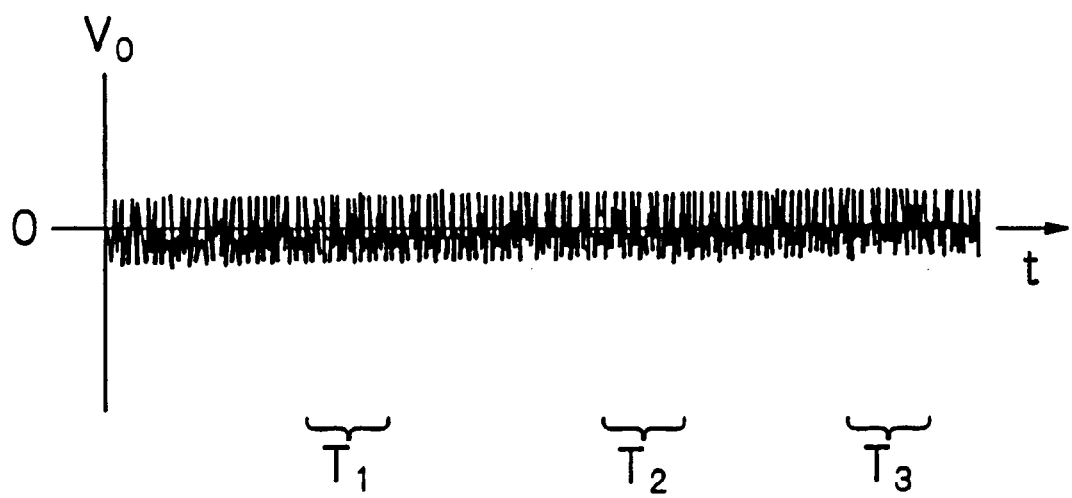

As is seen from FIGS. 5(A) and 5(B), significantly large noise was induced to the output voltage Vo during the periods T1, T2 and T3 in the first embodiment employing the single-layer mesh structure, while in the second embodiment using the double-layer mesh structure the voltage Vo did not include such noise as in the first embodiment. Therefore, it is obvious from the test that the double-layer mesh structure is quite effective to reduce noise influence from external to the output voltage.

Figure 6:
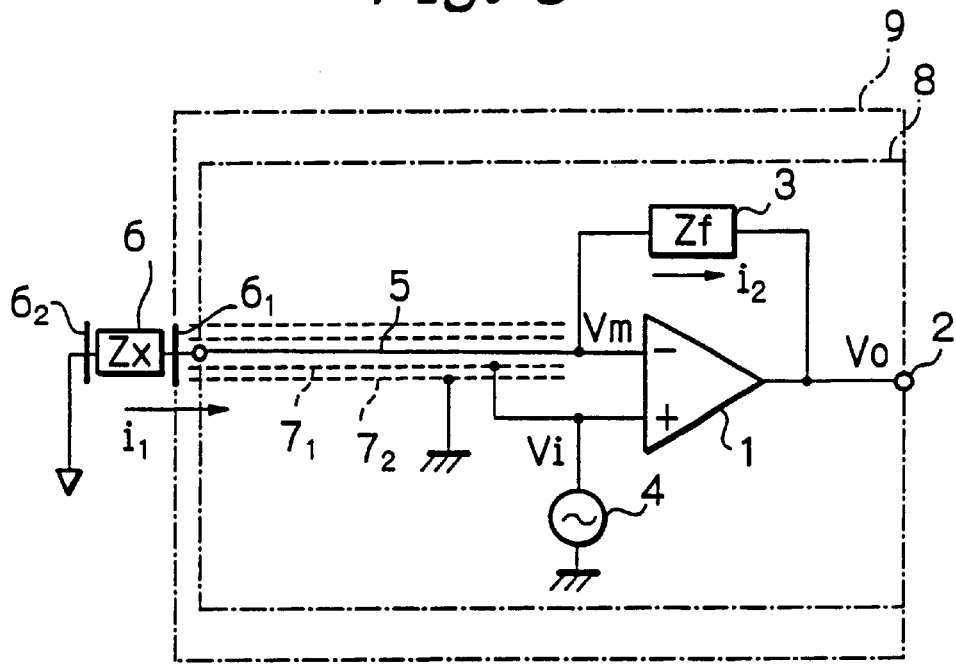
FIG. 6 shows a circuit diagram of a third embodiment of a Z/V converter according to the present invention.

FIG. 6 illustrates a third embodiment of a Z/V converter according to the present invention. While the third embodiment is similar to the second one in that a double-layer mesh structure is employed for a shielding means and an inner shielding means $7_1$ is connected to a non-inverting input terminal of an operational amplifier 1, the third embodiment does differ from the second embodiment in that an outer shield $7_2$ is grounded.

The grounded outer shield $7_2$ in the third embodiment, however, may cause an interlayer capacitance, i.e., parasitic capacitance between the inner shield $7_1$ and the outer shield $7_2$, which may have 1000 pF/m or more. The parasitic capacitance becomes larger as a coaxial cable (a signal line 5 and the inner and outer shields $7_2$, $7_2$) is longer. Also, a higher frequency signal from an AC signal generator 4 causes a reduction in impedance of the parasitic capacitance, and hence results in an increase in signal leak. Therefore, the third embodiment is preferably applied when a sensing electrode $6_1$ is positioned relatively close to the operational amplifier 1 and connected thereto with a relatively short coaxial cable, or when the frequency of a signal from the AC signal generator 4 is relatively low.

In each of the first to third embodiments according to the present invention, it is preferable to shield the whole signal line 5 by the shield 7 or the inner and outer shields apparatus $7_1$ and $7_2$. It is more preferable to shield the whole apparatus excluding the sensing electrode $6_1$. However, depending on application conditions of the Z/V converter, it may be possible to cover only a part of the signal line 5 (more than 10% thereof). Further, as mentioned above, the target 6 may be arbitrary impedance component such as a resistor, a capacitor, an inductor or any combination thereof.

When a capacitance element Cx is used as the target 6, the first to third embodiments provide capacitance-to-voltage (C/V) converters and therefore constitute capacitive sensors. In this case, an electrode $6_2$ of the capacitance element Cx is grounded, set at an appropriate bias voltage, or left in space. "Capacitive sensors" to which the present invention may be applicable include arbitrary capacitive sensors such as acceleration sensor, seismometer, pressure sensor, displacement sensor, displacement meter, proximity sensor, touch sensor, ion sensor, humidity sensor, rain drop sensor, snow sensor, lightning sensor, alignment sensor, touch failure sensor, shape sensor, end-point detecting sensor, vibration sensor, ultrasonic sensor, angular velocity sensor, flow sensor, gas sensor, infrared sensor, radiation sensor, level sensor, frost sensor, moisture sensor, vibration meter, charge sensor, and so on.

The present invention may also be applied to a printed circuit board tester. Specifically, for a printed circuit board determination is made as to whether it is usable or not in view of the magnitude, uniformity and so on of electrostatic capacitances parasitic on the board. When the target 6 is treated as each potion where the electrode $6_1$ touches on the board, a voltage corresponding to the electrostatic capacitance value Cx at the portion can be produced from the operational amplifier 1, thereby making it possible to determine whether the board is usable or not. In this case, a block 9 surrounded by a one-dot chain line in FIGS. 2, 4 and 6, including the electrode $6_1$ signal line 5, shield 7 or inner shield 7, and outer shield $7_2$, operational amplifier 1, feedback impedance circuit 3 and AC signal generator 4 can also constitute an electrostatic capacitance-to-voltage converter for outputting a voltage Vo which varies dependently on the electrostatic capacitance Cx. In addition, an electrostatic capacitance detector for deriving the capacitance value Cx can be implemented by combining the block 9 with a means for processing the output voltage Vo.

It is preferable that a capacitor is employed as the feedback impedance circuit 3 when the target 6 is a capacitive component, a resistor or a capacitor is employed as the feedback impedance circuit 3 when the target 6 is a resistive component, and one of an inductor, a resistor and a capacitor which exhibits the best S/N ratio is employed as the feedback impedance circuit 3 when the target 6 is an inductive component. By providing a feedback impedance circuit 3 having the same impedance characteristics as the target component 6, more noise may be reduced.

Figure 7:
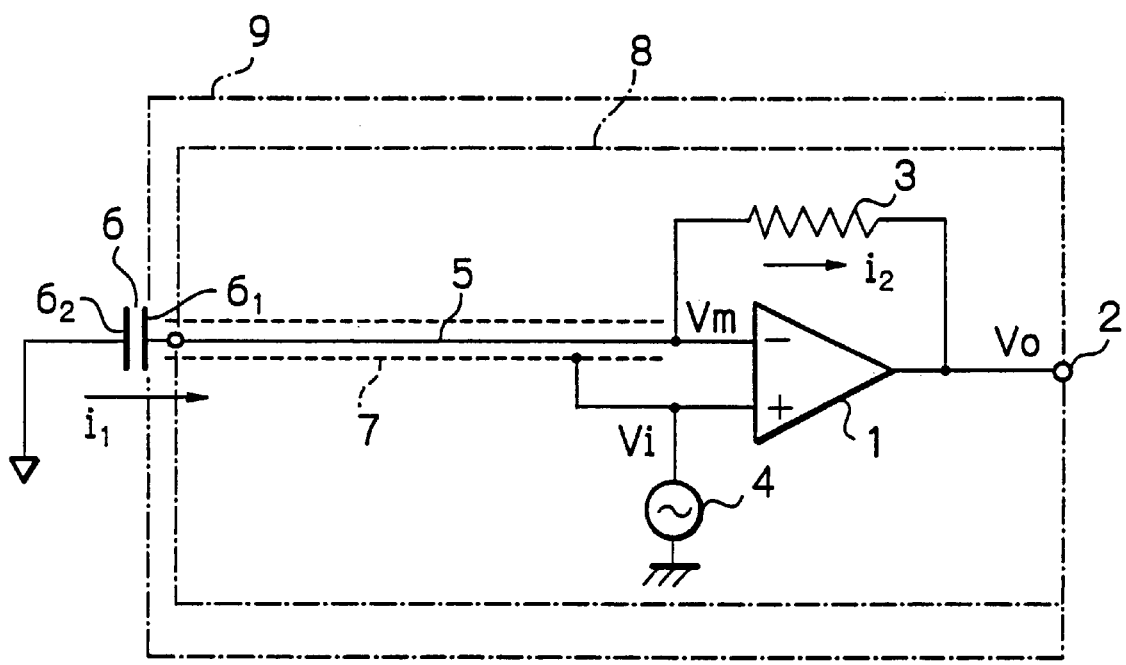
FIG. 7 is a circuit diagram of the first embodiment when the target has an electrostatic capacitance as its impedance and the feedback impedance circuit consists of a resistor.

It goes without saying, however, that an element having a different impedance characteristic may be combined with the target component 6. For example, as illustrated in FIG. 7, a resistor may be employed as the feedback impedance element 3 when the target 6 is a capacitive component Cx. The use of a resistor as the feedback impedance circuit facilitates the formation of the operational amplifier 1 and the feedback resistor 3 into one chip. In this case, assuming that the output of the AC signal generator 4 has an angular frequencyω, and the resistance value of the feedback resistor 3 is Rf, the output voltage Vo can be expressed from the equation (1) as follows:

$$Vo=Vi(1+j\omega RfCx) \tag{2}$$

Alternatively, a parallel circuit of a resistor and a capacitor or the like may be employed as the feedback impedance circuit 3. Further alternatively, any arbitrary combinations are possible.

As is apparent from the Equation (1), the connecting position of the feedback impedance circuit 3 may be replaced with that of the target 6 to be detected. That is, the target 6 may be connected between the inverting input terminal and the output terminal of the operational amplifier 1, while a known impedance circuit may be connected to the end of the signal line 5. In this case, shielding means need to be provided to cover two lines for connecting two sensing electrodes of the target 6 to the inverting input terminal and the output terminal of the operational amplifier 1.

The feedback impedance circuit 3 may also be an unknown impedance component, as well as the target 6. In this case, since Zf and Zx in the right side of the Eequation (1) are both unknown values, the output voltage Vo presents an AC voltage depending on the ratio of Zx to Zf (=Zf/Zx). As an exemplary application of such a configuration including two unknown impedance objects, a two-axis acceleration sensor is contemplated. The two-axis acceleration sensor operates such that as the impedance of one sensor becomes larger in response to increasing acceleration, the impedance of the other sensor becomes smaller. Therefore, the value of the impedance ratio largely varies even if the respective impedances exhibit small amounts of changes. Since the AC output voltage Vo varies correspondingly to the impedance ratio which largely varies even with such slight changes in the respective impedance value, it is possible to significantly improve the detection sensitivity of the two-axis acceleration sensor.

In the Z/V converter, for example, illustrated in FIG. 7, the feedback impedance circuit or element 3 may also be an unknown resistive component. When the impedances Zf=Rf and Zx=1/(ωCx) of the resistive component 3 and the capacitive component 6 vary in response to a variant Y such as pressure, temperature or the like, the value of the ratio Zf/Zx varies dependently on the variant Y, thus producing an output voltage Vo an amplitude of which varies in response to the variant Y.

Also, even if two unknown impedance components do not linearly vary in response to a certain variant Y, some combination of such impedance components may allow the output voltage Vo to linearly vary its amplitude in response to the variant Y. Conversely, even when respective impedance components linearly vary in response to a variant Y, the output voltage Vo may be made to non-linearly vary.

The present invention as described above, can produce positive effects as follows:
(1) Since a signal line connected to an impedance component or target component under detection and a shield surrounding the same are at the same voltage due to the imaginal-short of an operational amplifier, it is possible to produce a voltage which depends only on an impedance value of the target component without any influence of a parasitic capacitance possibly formed between the signal line and shield. Therefore, highly accurate Z/V conversion can be achieved even if only a very small impedance value is to be detected.
(2) Even if one electrode of a target component is biased to a certain voltage, it is possible to produce a voltage corresponding to an impedance value of the target component.
(3) With a shield made in double mesh structure, signal leak from a signal line and introduction of external noise into the signal line can be reduced while providing a flexible coaxial cable, thereby making it possible to realize highly accurate Z/V conversion.
(4) When a feedback impedance is treated as a second unknown impedance component, an output voltage corresponding to an impedance ratio of the two impedance components can be highly accurately produced without any influence of a parasitic capacitance of a signal line.
(5) Even if a signal line is relatively long, it is possible to accurately detect an impedance value of a target because stray capacitances between the signal line and shielding means are not affected by the length of the line,. and hence it is also possible to do so if an impedance value is small.

While preferred embodiments have been described using specific terms, such description is for illustrative purpose only, and it is to be understood that changes and variations may be made without departing from the spirit or scope of the following claims.

What is claimed is:

1. An impedance-to-voltage (Z/V) converter for converting an impedance of a target to a voltage comprising:
   an operational amplifier having a feedback impedance circuit connected between an output terminal and an inverting input terminal thereof;
   a signal line having one end connected to the inverting input terminal of the operational amplifier and the other end connected to one electrode of a target impedance;
   an alternating current (AC) voltage signal generator connected to a non-inverting input terminal of the operational amplifier and not to the target impedance and independently proving a constant voltage signal to the non-inverting input; and
   at least one shield which surrounds at least a portion of the signal line and is connected to the non-inverting input terminal of the operational amplifier and the AC signal generator.

2. The Z/V converter according to claim 1, wherein the shield includes a first shielding layer which comprises a mesh structure or tube structure.

3. The Z/V converter according to claim 2, wherein the shield further includes a second shielding layer surrounding the outer surface of the first shielding layer.

4. The Z/V converter according to claim 3, wherein the second shielding layer comprises a mesh structure or tube structure.

5. The Z/V converter according to claim 3, wherein the second shielding layer is connected to the non-inverting.

6. The Z/V converter according to claim 1, wherein the impedance of the target and the feedback impedance circuit both have the same characteristic selected from resistive, capacitive and inductive. input terminal of the operational amplifier and the AC signal generator.

7. An impedance-to-voltage (Z/V) converter for converting an impedance of a target to a voltage comprising:
   an operational amplifier having a feedback impedance circuit connected between an output terminal and an inverting input terminal thereof;
   a signal line having one end connected to the inverting input terminal of the operational amplifier and the other end connected to one electrode of a target impedance;

an alternating current (AC) signal generator connected to a non-inverting input terminal of the operational amplifier;

a first shield surrounding at least a portion of the signal line and connected to the non-inverting input terminal of the operational amplifier and the AC signal generator; and a second shield surrounding the outer surface of the first shield and connected to a reference voltage.

8. An impedance-to-voltage (Z/V) converter comprising:

an operational amplifier having a first target connected between an inverting input terminal and an output terminal thereof;

a signal line having one end connected to the inverting input terminal of the operational amplifier and the other end connected to one end of a second target;

an alternating current (AC) signal generator connected to a non-inverting input terminal of the operational amplifier;

a first shield which surrounds at least a portion of the signal line and is connected to the non-inverting input terminal of the operational amplifier and the AC signal generator; and a second shield surrounding the outer surface of the first shield layer and connected to a reference voltage.

9. An impedance-to-voltage (Z/V) converter comprising:

an operational amplifier having a first target connected between an inverting input terminal and an output terminal thereof;

a signal line having one end connected to the inverting input terminal of the operational amplifier and the other end connected to one end of a second target;

an alternating current (AC) voltage signal generator connected to a non-inverting input terminal of the operational amplifier and not to the second target and independently providing a constant voltage signal to the non-inverting input; and at least one shield which surrounds at least a portion of the signal line an is connected to the non-inverting input terminal of the operational amplifier and the AC signal generator.

10. The Z/V converter according to claim 9, wherein the shield includes a first shielding layer which comprises a mesh structure or tube structure.

11. The Z/V converter according to claim 10, wherein the shield further includes a second shielding layer surrounding the outer surface of the first shielding layer.

12. The Z/V converter according to claim 11, wherein the second shielding layer comprises a mesh structure or tube structure.

13. The Z/V converter according to claim 11, wherein the second shielding layer is connected to the non-inverting input terminal of the operational amplifier and the AC signal generator.

14. The Z/V converter according to claim 9, wherein the impedances of the first and second targets have the same characteristic selected from resistive, capacitive or inductive.

15. An impedance-to-voltage (A/V) converter for converting an impedance of a target to a voltage comprising:

an operational amplifier having a feedback impedance circuit connected between an output terminal and an inverting input terminal thereof, the inverting input terminal and a non-inverting input terminal being imaginal-short;

a signal line having one end connected to the inverting input terminal of the operational any amplifier and the other end connected to one end of a target impedance;

at least one shield which surrounds at least a portion of the signal line and is connected to the non-inverting input terminal of the operational amplifier; and an alternating current (AC) constant voltage signal generator connected to the non-inverting input terminal and not to the inverting input through the target impedance and independently providing a constant voltage signal to the non-inverting input.

16. An impedance-to-voltage converter comprising:

an operational amplifier having a first target connected between an inverting input terminal and an output terminal thereof, the inverting input terminal and a non-inverting input terminal being imaginal short;

a signal line having one end connected to the inverting input terminal of the operational amplifier and the other end connected to one end of a second target;

at least one shield which surrounds at least a portion of the signal line and is connected to the non-inverting input terminal of the operational amplifier; and an alternating current (AC) constant voltage signal generator connected to the non-inverting input terminal and not to the inverting input through the second target impedance and independently providing a constant voltage signal to the non-inverting input.

17. An impedance-to-voltage (Z/V) converter for converting an impedance of a target to a voltage comprising:

an operational amplifier having a resistance connected between an output terminal and an inverting input terminal thereof;

a signal line having one end connected to the inverting input terminal of the operational amplifier and the other end connected to one electrode of an electrostatic capacitance target;

an alternating current (AC) voltage signal generator connected to a non-inverting input terminal of the operational amplifier and not to the electrostatic capacitance; and at least one shield which surrounds at least a portion of the signal line and is connected to the non-inverting input terminal of the operational amplifier and the AC signal generator.

18. An impedance-to-voltage (Z/V) converter comprising:

an operational amplifier having a resistance connected between an inverting input terminal and an output terminal thereof;

a signal line having one end connected to the inverting input terminal of the operational amplifier and the other end connected to one end of an electrostatic capacitance;

an alternating current (AC) voltage signal generator connected to a non-inverting input terminal of the operational amplifier and not to the electrostatic capacitance; and at least one shield which surrounds at least a portion of the signal line an is connected to the non-inverting input terminal of the operational amplifier and the AC signal generator.

* * * * *

UNITED STATES PATENT AND TRADEMARK OFFICE
CERTIFICATE OF CORRECTION

PATENT NO. : 6,335,642 B1
DATED : January 1, 2002
INVENTOR(S) : Hiroshima et al.

It is certified that error appears in the above-identified patent and that said Letters Patent is hereby corrected as shown below:

Column 8,
Line 54, after the word "non-inverting," insert -- input terminal of the operational amplifier and the AC signal generator --.
Lines 58-59, delete "input terminal of the operational amplifier and the AC signal generator."

Column 9,
Line 41, change "an" to -- and --.

Column 10,
Line 63, change "an" to -- and --.

Signed and Sealed this

Thirteenth Day of April, 2004

JON W. DUDAS
*Acting Director of the United States Patent and Trademark Office*